United States Patent
Komatsu et al.

(10) Patent No.: US 7,026,098 B2
(45) Date of Patent: Apr. 11, 2006

(54) ELECTRON BEAM LITHOGRAPHY METHOD

(75) Inventors: Kazunori Komatsu, Odawara (JP); Toshihiro Usa, Odawara (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/700,626

(22) Filed: Nov. 5, 2003

(65) Prior Publication Data

US 2004/0091817 A1  May 13, 2004

(30) Foreign Application Priority Data

Nov. 6, 2002 (JP) ............................. 2002-322543

(51) Int. Cl.
*G03C 5/00* (2006.01)
*G11B 5/82* (2006.01)
(52) U.S. Cl. ...................... 430/296; 430/942; 360/135
(58) Field of Classification Search ................ 430/296, 430/942; 360/135
See application file for complete search history.

(56) References Cited

U.S. PATENT DOCUMENTS

| | | | | |
|---|---|---|---|---|
| 6,423,968 | B1 * | 7/2002 | Panzer et al. | ................ 250/307 |
| 6,784,442 | B1 * | 8/2004 | Muraki et al. | ............ 250/492.2 |
| 2001/0028964 | A1 | 10/2001 | Nagao et al. | ......... 428/694 SG |
| 2002/0172130 | A1 * | 11/2002 | Wada | |
| 2004/0057158 | A1 * | 3/2004 | Usa et al. | .................... 360/135 |
| 2004/0240366 | A1 * | 12/2004 | Tomita | .................... 369/59.25 |

FOREIGN PATENT DOCUMENTS

| | | | |
|---|---|---|---|
| EP | 1152417 | * | 11/2001 |
| EP | 1187121 | * | 3/2002 |
| JP | 2000207738 | * | 7/2000 |
| JP | 2001-110050 A | | 4/2001 |
| JP | 2001202663 | * | 7/2001 |
| JP | 2002050084 | * | 2/2002 |
| JP | 2002298447 | * | 10/2002 |

* cited by examiner

*Primary Examiner*—Christopher G. Young
(74) *Attorney, Agent, or Firm*—Sughrue Mion, PLLC

(57) ABSTRACT

An electron beam lithography method for performing lithography of elements included in a pattern by scanning a disk having resist coated thereon, placed on a rotating stage which is movable in a radial direction of the disk, with an electron beam while rotating the rotating stage. The electron beam has a beam diameter smaller than a minimum width of an element shape. The electron beam is reciprocally oscillated in a circumferential direction X approximately orthogonal to a radial direction Y of the disk and deflected in the radial direction Y, thereby filling in the element shape. Lithography of the elements is sequentially performed by rotating the disk unidirectionally, and thus a desired micropattern is drawn in the entire region of the disk. A lithographic length L of the element in the circumferential direction X may be defined by amplitude of the reciprocal oscillation of the electron beam.

16 Claims, 3 Drawing Sheets

ELECTRON BEAM LITHOGRAPHY METHOD

BACKGROUND OF THE INVENTION

1. Field of the Invention

The present invention relates to an electron beam lithography method for performing lithography exposure of elements included in a pattern by use of an electron beam onto resist provided on a disk to form an uneven pattern and the like of a master carrier for magnetic transfer during manufacture of the master carrier for magnetic transfer and the like.

2. Description of the Related Art

A magnetic transfer method for transferring and recording a magnetization pattern corresponding to information (for example, servo signals) carried by a master carrier for magnetic transfer onto a slave medium is known. The magnetization pattern is transferred by applying a transfer magnetic field in a state where the master carrier and the slave medium closely contact with each other. The master carrier carries transfer information by means of a fine magnetic uneven pattern and the slave medium has a magnetic recording part for receiving the transfer.

As a method for manufacturing the master carrier used in this magnetic transfer, applying a method for manufacturing an optical disk stamper is being considered. In this method, a master carrier is manufactured based on a master disk having an uneven pattern formed thereon by use of resist corresponding to information to be transferred (for example, see U.S. Patent Laid-Open No. 20010028964.)

In manufacturing the above-described optical disk stamper, resist is applied to a disk (a glass plate or the like) Data are converted into lengths of pits, and written into the resist by irradiating the disk with a laser beam modulated according to the converted data while the disk is rotated.

In the case of manufacturing the master carrier for magnetic transfer also, performing lithography of a micropattern by irradiating a laser beam modulated according to information to be transferred while rotating a disk having resist applied thereto is generally considered, similarly to the manufacture of the above-described optical disk stamper.

However, manufacture of miniaturized and higher-capacity magnetic disk media is being attempted. When a bit length or a track width is narrowed in accordance with an increase in recording density (for example, when the bit length or the track width becomes 0.3 µm or less), the lithography diameter approaches the limit of a diameter capable of being exposed by a laser beam, and ends of drawn portions come to have an arcuate shape. Accordingly, it becomes difficult to form rectangular elements of a pattern. Particularly, an upper surface of each element included in a pattern formed in a master carrier has a shape corresponding to this drawn portion. When the ends of the drawn portions have the arcuate shape, the upper surface of a protruded portion of the uneven pattern on a master carrier board has a shape greatly different from a rectangular shape, such as an arcuate shape. Accordingly, it becomes difficult to form a desired magnetization pattern in a slave medium.

Meanwhile, in the field of semiconductors, patterning utilizing an electron beam capable of performing exposure by use of a spot having a smaller diameter than that of the laser beam is being performed. The use of this electron beam enables highly accurate patterning of a micropattern.

Moreover, in manufacturing of patterned media expected to be realized as miniature and light weight high-density magnetic recording media, it has been proposed to perform pattern exposure by use of an electron beam (for example, see Japanese Unexamined Patent Publication No. 2001-110050).

In manufacturing of the above-described master carrier for magnetic transfer and patterned media, it is required to perform concentric patterning. Therefore, good pattern formation is difficult by direct application of an electron beam lithography method using an XY stage, which is utilized in the field of semiconductors. For this reason, an electron beam lithography method capable of good pattern lithography is desired. Moreover, in achieving a higher-capacity optical disk, since there arises a problem similar to that of the above-described master carrier for magnetic transfer, an electron beam lithography method capable of drawing a spiral micropattern is likely to be required.

In the lithography of such a micropattern as described above, the number of lithographic elements becomes enormous along with an increase in the number of tracks (the number of sectors). Accordingly, there are demands for shortening of lithographic time by improving a lithographic speed, for improvement in a lithographic shape and lithographic position accuracy in the entire disk region, and for uniformity of exposure. Particularly, in drawing a concentric or spiral micropattern while rotating a disk, it is required to cause element forming positions corresponding to rotation phases of the disk to be continuous from an inner periphery side to an outer periphery side. In addition, accuracy of a length of an element in its circumferential direction is required.

For example, in the case of a micropattern of a CAV type, the rotational speed of a disk is constant. Therefore, when recording the same data in both inner and outer periphery sides of the disk, lengths of lithographic elements in the circumferential direction have to be formed shorter in the inner periphery side and longer in the outer periphery side. Accordingly, it is difficult to secure the formation accuracy thereof. Moreover, when recording, for example, servo signals, it is difficult to cause origins of elements at the inner and outer periphery sides to coincide with a reference position of a rotation phase. Moreover, due to accumulation of errors and the like, it is difficult to dispose a number of patterns at even intervals within one lap of the disk.

Further, in exposure using the electron beam, element formation accuracy is also influenced by lithography using a uniform exposure amount corresponding to sensitivity of resist on the entire surface of a disk. However, control thereof is complicated in relation to a rotation speed and the like.

SUMMARY OF THE INVENTION

In consideration for the foregoing circumstances, it is an object of the present invention to provide an electron beam lithography method capable of high-speed lithography of a micropattern on the entire surface of a disk with high accuracy and uniformity.

The electron beam lithography method of the present invention is one for performing lithography of elements included in a pattern by scanning a disk having resist coated thereon, placed on a rotating stage which is movable in a radial direction of the disk, with an electron beam while rotating the rotating stage. In the method, the electron beam having a beam diameter smaller than a minimum width of an element shape is oscillated reciprocally at high speed in a circumferential direction approximately orthogonal to the radial direction of the disk while being deflected in the radial direction. Thus, scanning of the electron beam is performed so as to fill in the element shape, and lithography of the elements is sequentially performed by rotating the disk unidirectionally.

During lithography of the elements, it is preferable that a lithographic length of the element in the circumferential direction is defined by the amplitude of the reciprocal oscillation of the electron beam in the circumferential direction.

Moreover, it is preferable to control a rotation speed of the disk so that rotations of the disk have the same linear velocity in lithography of both portions at outer and inner peripheral sides of the disk. Specifically, it is preferable to perform lithography at a constant linear velocity in the entire lithographic region of the disk.

On the other hand, when the pattern is of the CAV (constant angular velocity) type, it is preferable that a deflection speed of the electron beam in the radial direction is changed to be slower as a distance of a lithographic portion from a rotational center of the disk is increased. Specifically, it is preferable that the deflection speed of the electron beam is changed to be slow in the outer peripheral side portion of the disk and fast in the inner peripheral side portion thereof so that a lithographic area per unit time is set constant. In this event, the lithography can be performed under conditions where frequency of the oscillation of the electron beam in the circumferential direction and intensity of the electron beam are set constant.

Moreover, it is preferable that timing of a lithographic data sending signal for scanning of the electron beam is controlled based on a reference clock signal generated in accordance with the rotation of the rotating stage and that the number of cycles of the reference clock signals per rotation is set to an integral multiple of a value obtained by dividing a length of one lap by a length of the smallest element in the circumferential direction. That is, at least a lithography start position of each element is caused to coincide with a reference clock.

In this event, it is preferable that one lap of the rotating stage is divided into a plurality of regions, and the reference clock signal and the lithographic data sending signal are synchronized with each other at an origin of each of the regions.

The "elements included in the pattern" are recording elements formed to record signals corresponding to information in tracks. Each element usually has a shape of a rough parallelogram including a rectangle and is surrounded by sides parallel to a track direction and perpendicular or inclined sides intersecting with the track direction.

An electron beam lithography apparatus for carrying out the lithography method of the present invention includes: a rotating stage for rotatably supporting a disk; a mechanism for linearly moving the rotating stage; means for drive-controlling a rotation speed of the rotating stage and the linear movement thereof; means for generating the reference clock signals in accordance with the rotation of the rotating stage; an electron beam device which oscillates an electron beam reciprocally at high speed in the circumferential direction and deflects the electron beam in the radial direction; means for sending lithographic data signals for scanning of the electron beam in accordance with each element of a pattern; and control means for controlling these operations in liaison with each other.

Note that the electron beam lithography method of the present invention can be applied to patterning on the premise of concentric or spiral rotating media necessary in a process of manufacturing disk-shaped media such as a master carrier for magnetic transfer, a patterned medium and an optical disk. In manufacturing of the master carrier for magnetic transfer or the patterned medium, a concentric pattern is drawn, whereas in manufacturing of the optical disk, a spiral pattern is drawn. For example, in lithography of the concentric pattern, the rotating stage is moved by a predetermined distance in the radial direction each time the rotating stage is rotated once or more. In lithography of the spiral pattern, the rotating stage is moved continuously in the radial direction.

In the electron beam lithography method of the present invention, the electron beam is oscillated reciprocally at high speed in the circumferential direction approximately orthogonal to the radial direction of the disk and deflected in the radial direction, thereby performing scanning of the electron beam so as to fill in the shapes of the elements. The lithography of the elements is sequentially performed, and thus a micropattern can be uniformly drawn at high speed and with high accuracy on the entire surface of the disk. That is, lithographic time can be shortened by improving a lithographic speed. Moreover, improvement in a lithographic shape and in lithographic position accuracy in the entire region of the disk and uniform exposure thereon can be achieved.

DESCRIPTION OF THE PREFERRED EMBODIMENTS

Figure 1A:
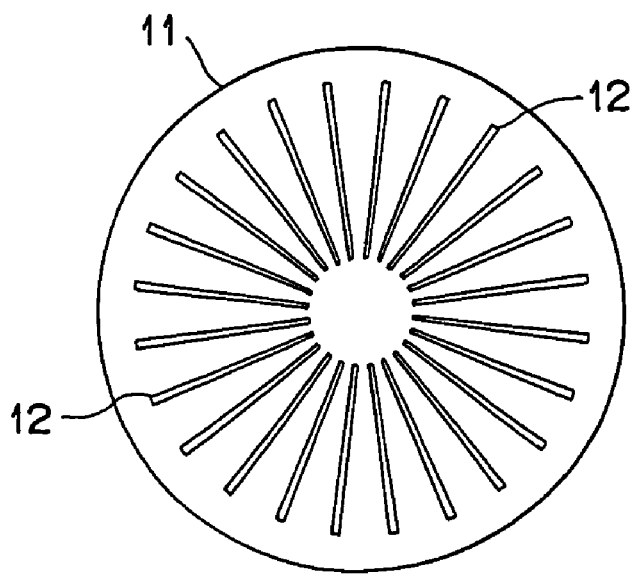
FIG. 1A is a plan view showing a pattern of a master carrier for magnetic transfer, which is drawn by use of an electron beam lithography method of the present invention.
Figure 1B:
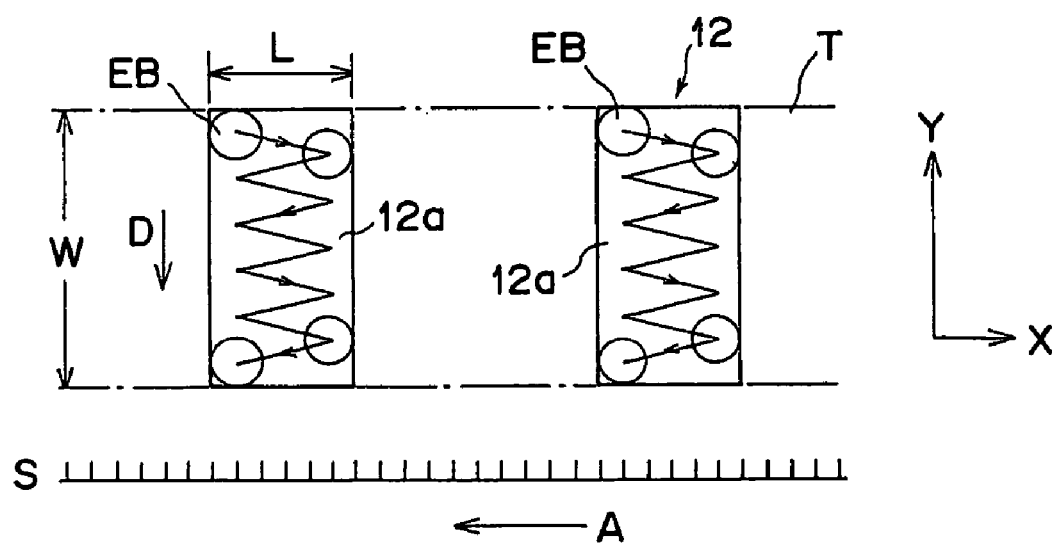
FIG. 1B is magnified schematic view showing a basic lithography mode of elements included in the pattern.
Figure 2:
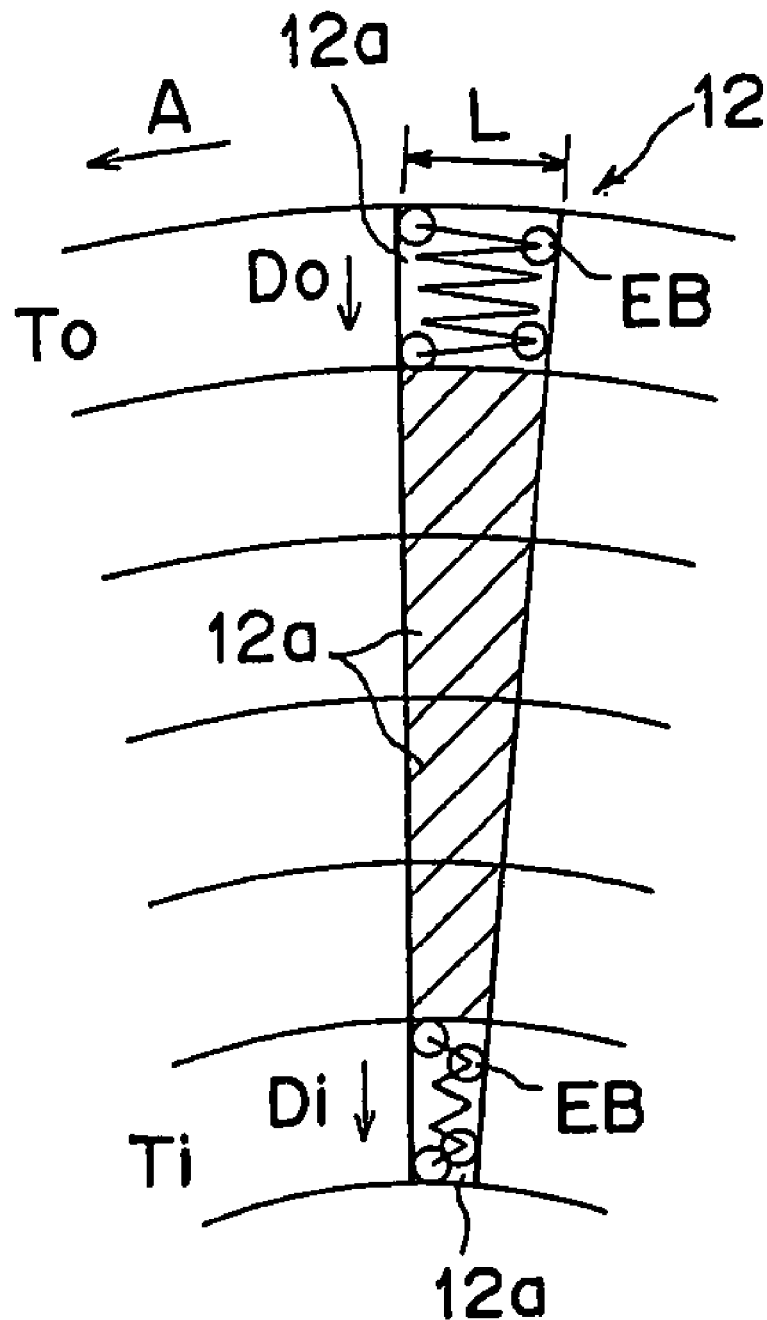
FIG. 2 is a magnified schematic view showing a lithography mode of a pattern of the CAV type.
Figure 3A:
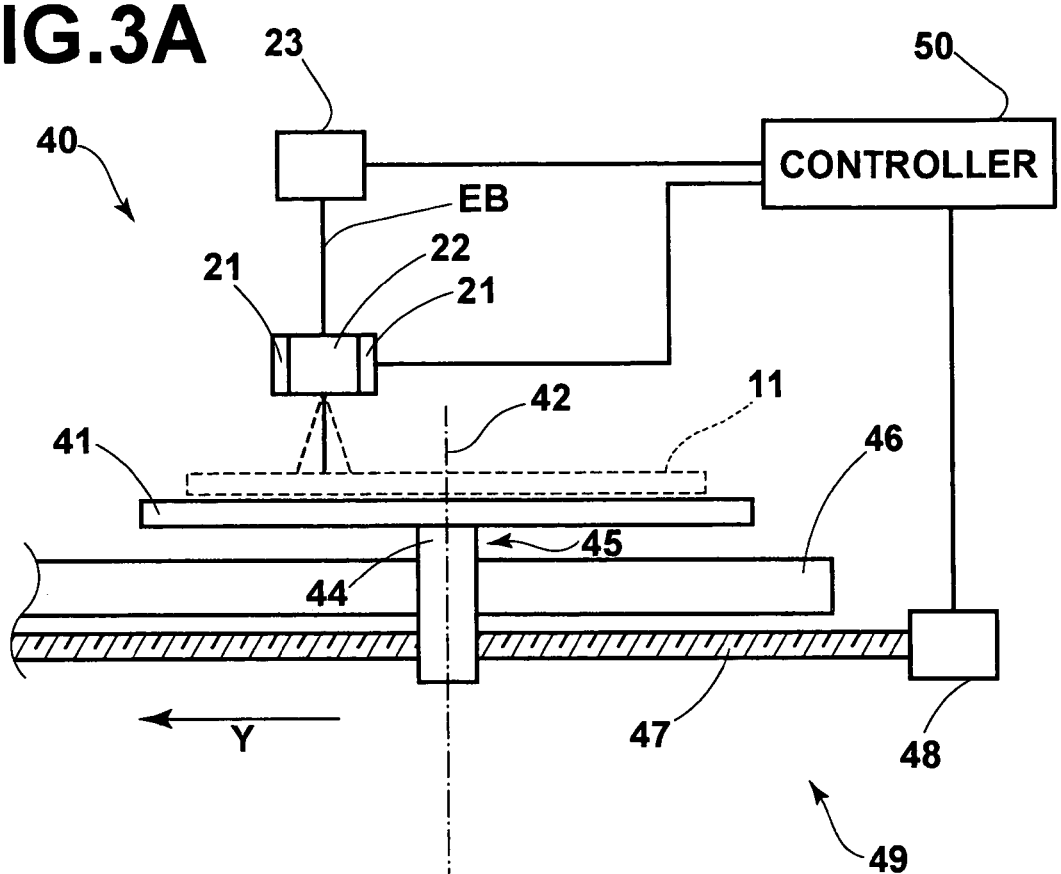
FIGS. 3A and 3B are side and top views, respectively, of the main parts of an electron beam lithography apparatus according to one embodiment, for carrying out the electron beam lithography method of the present invention.
Figure 3B:
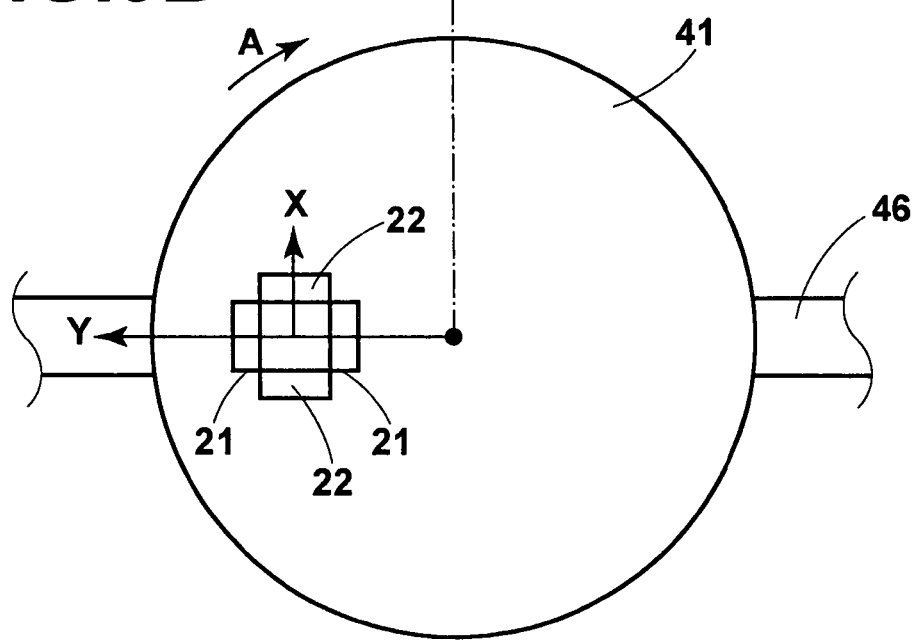

With reference to the drawings, embodiments of the present invention will be described below in detail. FIG. 1A is a plan view showing a pattern of a master carrier for magnetic transfer, which is drawn by use of an electron beam lithography method of the present invention. FIG. 1B is a magnified schematic view showing a basic lithography mode of elements included in the pattern. FIG. 2 is a magnified schematic view showing a lithography mode of the CAV type. FIGS. 3A and 3B are side and top views, respectively, of the main parts of an electron beam lithography apparatus according to an embodiment in which the electron beam lithography method of the present invention is carried out.

As shown in FIG. 1A, a pattern 12 (servo pattern) having minute irregularities formed on a master carrier for magnetic transfer is formed in a circular region excluding inner and outer periphery portions on a disk 11 (circular substrate). This pattern 12 is in the case where transfer information is a servo signal and formed in narrow-width regions extending approximately in radial directions from the center of the disk at even intervals on concentric tracks of the disk 11. Note that, in the case of the servo pattern 12, the pattern may be formed to have a curved radial shape continuous in a radial direction, other than the linear radial shape.

When part of the pattern 12 is enlarged, as shown in FIG. 1B, the pattern is constructed by aggregations of minute elements 12a corresponding to information to be transferred in concentric tracks T. For example, a shape of the element 12a in the case shown in FIG. 1B is a rectangle having a width W and a length (a bit length) L. In a final master carrier, portions of the elements 12a become protruded or grooved portions and the other portions become flat portions (lands)

When a recording method of the above-described pattern 12 is the CAV (constant angular velocity) type, in accordance with a change in length of a sector between the inner and outer peripheries thereof, lengths L of the elements 12a in a circumferential direction thereof are formed to be long in an outer track To and short in an inner track Ti, as shown in FIG. 2. Moreover, the pattern 12 is formed so as to cause origins of the inner and outer elements 12a to coincide with a reference position of a rotation phase.

In lithography of each element 12a of the foregoing pattern 12, the disk 11 having resist coated on its surface is placed on a rotating stage 41 to be described later (see FIG. 3) and the disk 11 is rotated. Exposure of the resist is performed by scanning the elements 12a by use of an electron beam EB for one track or a plurality of tracks at a time, for example, in a direction from the outer track To toward the inner track Ti or in a direction opposite thereto.

A basic aspect of the electron beam lithography method of the present invention is as follows. Specifically, as shown in FIG. 1B, while rotating the disk 11 in one direction A, the element 12a is scanned by use of the electron beam EB with a minute diameter so as to fill in the rectangular shape of the element 12a at a predetermined phase position of the concentric track T (the track width: W), which extends linearly when viewed microscopically, in the circumferential direction X orthogonal to the radial direction Y of the disk 11.

In the above-described scanning, the electron beam EB having a beam diameter smaller than the minimum width of the elements 12a is rapidly oscillated reciprocally at a constant amplitude L in the circumferential direction X approximately orthogonal to the radial direction Y. At the same time, the electron beam EB is deflected in the radial direction Y. Thus, the electron beam EB scans the element 12a so as to fill in the shape of the element 12a with a trail of triangular waves, and lithography of the elements 12a is sequentially performed. After performing the lithography for one lap of the track T, the electron beam EB moves to the next track T, where lithography is similarly performed. Thus, a desired micropattern 12 is drawn across the entire region of the disk 11.

Note that the movement of the electron beam EB between tracks is performed by linearly moving the rotating stage 41 to be described later in the radial direction Y. The movement is performed either for each lithography operation of one track or for each lithography operation of a plurality of tracks in accordance with a range in which the electron beam EB can be deflected.

Moreover, in the case where an electron gun emitting the electron beam EB is fixed as described later, the rotating stage 41 is rotated and moved during lithography of one rectangular element 12a, and therefore the drawing locus is shifted. When the influence of the shifted drawing locus cannot be ignored, it is required to perform deflection D in the radial direction Y while deflecting the center of the reciprocal oscillation of the electron beam EB in the same direction as a rotation direction of the rotating stage 41 in accordance with a rotation speed thereof. Meanwhile, when the shape of the element 12a of the pattern 12 is not a rectangle but a parallelogram forming an angle with a track direction, the deflection D in the radial direction Y is performed while deflecting the center of the reciprocal oscillation of the electron beam EB in accordance with the angle.

The length L of lithography of the foregoing element 12a in the circumferential direction X is defined by the amplitude of the reciprocal oscillation in the circumferential direction of the electron beam EB. When the length L of the element 12a in the circumferential direction exceeds the amplitude range of the electron beam EB, lithography is performed a plurality of times.

Moreover, in terms of obtaining uniform exposure and securing lithographic position accuracy, it is preferable that lithography using the electron beam EB is performed in the following manner. Specifically, as to the movement of the position of a lithographic portion in the radial direction, that is, the movement between the tracks in the lithographic region of the disk 11, the rotation speed of the rotating stage 41 is controlled to be slow during the lithography of the outer periphery side and fast during the lithography of the inner periphery side so as to have the same linear velocity in the entire lithographic region regardless of the portions at the outer and inner peripheral sides of the disk 11.

Moreover, as shown in FIG. 1B, scanning of the electron beam EB is performed as described above in order to draw the elements 12a. Here, a lithographic data signal for controlling the scanning of the electron beam EB is sent to control the scanning of the electron beam EB. Timing and phase of this sent signal are controlled based on a reference clock signal S generated in accordance with the rotation of the rotating stage 41. The reference clock signal S is generated for each predetermined angle (for each predetermined length in the circumferential direction) along with the rotation of the rotating stage 41. Accordingly, the number of cycles of the reference clock signals S generated during one rotation of the rotating stage 41 is set in accordance with the length L (phase angle) of the smallest element 12a in the circumferential direction. In other words, the number of cycles of the reference clock signals S per rotation is set to an integral multiple of a value obtained by dividing a length of one lap (360° by the phase angle) in a specific track by the length L of the smallest element 12a in the circumferential direction. Thus, an integer number of reference clock signals S can be obtained in accordance with the length L of the element 12a in the circumferential direction, lithography start and end positions of each element 12a coincide with the reference clock signal S, and control thereof can be accurately performed. Note that the lengths of the elements 12a, included in the pattern 12, in the circumferential direction are usually set to integral multiples of the length of the smallest element 12a in the circumferential direction.

It is necessary to synchronize the above-described lithographic data sending signal with the reference clock signal S. These signals are synchronized with each other not only at the reference position during one rotation of the rotating stage 41 but also at a plurality of positions to enhance positional accuracy. For example, one lap is divided into a plurality of phase regions, and the reference clock signal S and the lithographic data sending signal are synchronized with each other at an origin of each phase region, that is, at each predetermined phase angle.

On the other hand, when the pattern 12 is of the CAV type as shown in FIG. 2, the lengths L of the elements 12a in the circumferential direction are formed to be short in the inner track Ti and long in the outer track To as described above. Moreover, the origins of the inner and outer elements 12a are formed so as to coincide with the reference position of the rotation phase. In this case, in drawing the elements 12a, the speed of the deflection D in the radial direction Y is changed in such a manner that deflection speed Do in drawing the outer track To is slow and deflection speed Di in drawing the inner track Ti is fast. Specifically, the speed is changed to be slower as the distance between the lithographic portion and the rotation center of the disk 11 increases. Accordingly, a lithographic area of the electron beam EB per unit time in each element 12a is set constant. Thus, the exposure of the elements 12a can be uniformly performed under the same conditions. In other words, the exposure can be performed under stable conditions where the frequency of the reciprocal oscillation of the electron beam EB in the circumferential direction and the intensity of the electron beam are set constant.

In order to perform the lithography as described above, an electron beam lithography apparatus 40 as shown in FIGS. 3A and 3B is used. This electron beam lithography apparatus 40 includes: a rotating stage unit 45 which includes the rotating stage 41 supporting the disk 11 and a spindle motor 44 having a motor axis provided so as to coincide with a center axis 42 of the stage 41; a shaft 46 which penetrates part of the rotating stage unit 45 and extends in one radial direction Y of the rotating stage 41; and linear movement means 49 for moving the rotating stage unit 45 along the shaft 46. A precisely threaded rod 47 which is disposed parallel with the shaft 46 is screwed in a part of the rotating stage unit 45. Normal and reverse rotations of this rod 47 are performed by a pulse motor 48, and this rod 47 and the pulse motor 48 are included in the linear movement means 49 of the rotating stage unit 45. Moreover, the apparatus includes means (not shown) for generating the reference clock signals S in accordance with the rotation of the rotating stage 41.

Furthermore, the electron beam lithography apparatus 40 includes: an electron gun 23 emitting the electron beam EB; and deflection means 21 and 22 for deflecting the electron beam EB in the Y direction (disk diameter direction) and the X direction (circumferential direction) orthogonal to the Y direction, respectively. The electron beam EB emitted from the electron gun 23 is irradiated on the disk 11 through the deflection means 21 and 22, an unillustrated lens and the like. Note that, in lithography of a pattern, the electron beam EB is subjected to minute reciprocal oscillation at constant amplitude in the circumferential direction X of the disk 11 by controlling the deflection means 21 and 22.

Drive of the spindle motor 44, that is, a rotation speed of the rotating stage 41, drive of the pulse motor 48, that is, linear movement by the linear movement means 49, modulation of the electron beam EB, control of the deflection means 21 and 22 and the like are performed by lithographic data signals sent from a controller 50 which serves as control means, based on the reference clock signal.

During lithography of a concentric pattern, the rotating stage 41 is moved by a predetermined distance for each rotation of the rotating stage 41. In lithography of a spiral pattern, the rotating stage 41 is linearly moved substantially continuously.

The disk 11 placed on the rotating stage 41 is made of, for example, silicon, glass or quartz, and its surface is previously coated with positive resist for electron beam lithography.

In lithography using the foregoing lithography apparatus 40, while the disk 11 is rotated in an A direction, the Y and X direction deflection means 21 and 22 are controlled by being synchronized with each other by use of periodic function signals such as triangle waves, and the electron beam EB is periodically oscillated at constant amplitude in a predetermined direction. As a result, the element 12a is scanned more than once in the circumferential direction X by the electron beam EB and the shape of the element 12a is drawn. Lithography of the pattern 12 is performed by repeating the above operation.

Note that it is preferable to control output of the electron beam EB and a beam diameter while taking account of the shape of each element 12a and sensitivity of the resist for electron beam lithography.

What is claimed is:

1. An electron beam lithography method for performing lithography of elements included in a pattern by scanning a disk having resist coated thereon, placed on a rotating stage which is movable in a radial direction of the disk, with an electron beam while rotating the rotating stage, comprising the steps of:

performing scanning of the electron beam so as to fill in an element shape by reciprocally oscillating the electron beam having a beam diameter smaller than a minimum width of the element shape at high speed in a circumferential direction approximately orthogonal to the radial direction of the disk and deflecting the electron beam in the radial direction; and sequentially performing lithography of the elements by rotating the disk unidirectionally.

2. The electron beam lithography method according to claim 1, wherein a lithographic length of the element in the circumferential direction is defined by amplitude of reciprocal oscillation of the electron beam in the circumferential direction.

3. The electron beam lithography method according to claim 1, wherein a rotation speed of the disk is controlled so that rotations of the disk have the same linear velocity in lithography of both portions at outer and inner peripheral sides of the disk.

4. The electron beam lithography method according to claim 2, wherein a rotation speed of the disk is controlled so that rotations of the disk have the same linear velocity in lithography of both portions at outer and inner peripheral sides of the disk.

5. The electron beam lithography method according to claim 1, wherein, when the pattern is of a CAV type, a deflection feed speed of the electron beam in the radial direction is changed to be slower as a distance of a lithographic portion from a rotation center of the disk is increased.

6. The electron beam lithography method according to claim 2, wherein, when the pattern is of a CAV type, a deflection speed of the electron beam in the radial direction is changed to be slower as a distance of a lithographic portion from a rotation center of the disk is increased.

7. The electron beam lithography method according to claim 3, wherein, when the pattern is of a CAV type, a deflection speed of the electron beam in the radial direction is changed to be slower as a distance of a lithographic portion from a rotation center of the disk is increased.

8. The electron beam lithography method according to claim 4, wherein, when the pattern is of a CAV type, a deflection speed of the electron beam in the radial direction is changed to be slower as a distance of a lithographic portion from a rotation center of the disk is increased.

9. The electron beam lithography method according to claim 1, wherein timing of a lithographic data sending signal for scanning of the electron beam is controlled based on a reference clock signal generated in accordance with rotation of the rotating stage, and the number of cycles of the reference clock signals per rotation is set to an integral multiple of a value obtained by dividing a length of one lap by a length of a smallest element in the circumferential direction.

10. The electron beam lithography method according to claim 2, wherein timing of a lithographic data sending signal for scanning of the electron beam is controlled based on a reference clock signal generated in accordance with rotation of the rotating stage, and the number of cycles of the reference clock signals per rotation is set to an integral multiple of a value obtained by dividing a length of one lap by a length of a smallest element in the circumferential direction.

11. The electron beam lithography method according to claim 3, wherein timing of a lithographic data sending signal for scanning of the electron beam is controlled based on a reference clock signal generated in accordance with rotation of the rotating stage, and the number of cycles of the reference clock signals per rotation is set to an integral multiple of a value obtained by dividing a length of one lap by a length of a smallest element in the circumferential direction.

12. The electron beam lithography method according to claim 5, wherein timing of a lithographic data sending signal for scanning of the electron beam is controlled based on a reference clock signal generated in accordance with rotation of the rotating stage, and the number of cycles of the reference clock signals per rotation is set to an integral multiple of a value obtained by dividing a length of one lap by a length of a smallest element in the circumferential direction.

13. The electron beam lithography method according to claim 9, wherein one lap of the rotating stage is divided into a plurality of regions, and the reference clock signal and the lithographic data sending signal are synchronized with each other at an origin of each of the regions.

14. The electron beam lithography method according to claim 10, wherein one lap of the rotating stage is divided into a plurality of regions, and the reference clock signal and the lithographic data sending signal are synchronized with each other at an origin of each of the regions.

15. The electron beam lithography method according to claim 11, wherein one lap of the rotating stage is divided into a plurality of regions, and the reference clock signal and the lithographic data sending signal are synchronized with each other at an origin of each of the regions.

16. The electron beam lithography method according to claim 12, wherein one lap of the rotating stage is divided into a plurality of regions, and the reference clock signal and the lithographic data sending signal are synchronized with each other at an origin of each of the regions.

* * * * *